United States Patent [19]

Merchant

[11] Patent Number: 5,227,087
[45] Date of Patent: Jul. 13, 1993

[54] CONSTANT-BOILING, AZEOTROPE-LIKE MIXTURES OF DICHLOROTRIFLUOROETHANE, 1,1-DICHLORO-1-FLUOROETHANE AND METHANOL AND/OR ETHANOL

[75] Inventor: Abid N. Merchant, Wilmington, Del.

[73] Assignee: E. I. Du Pont de Nemours and Company, Wilmington, Del.

[21] Appl. No.: 297,366

[22] Filed: Jan. 17, 1989

[51] Int. Cl.$^5$ .................... C11D 7/30; C11D 7/50; C23G 5/028; C08J 9/14
[52] U.S. Cl. .................... 252/171; 134/12; 134/31; 134/38; 134/40; 252/162; 252/170; 252/364; 252/DIG. 9; 264/53; 264/DIG. 5; 521/98; 521/131
[58] Field of Search ............... 252/162, 170, 171, 172, 252/364, DIG. 9; 134/12, 38, 39, 40, 31; 521/131, 98; 264/53, DIG. 5

[56] References Cited

U.S. PATENT DOCUMENTS

| | | | |
|---|---|---|---|
| 4,816,174 | 3/1989 | Lund et al. | 252/171 |
| 4,816,176 | 3/1989 | Lund et al. | 252/171 |
| 4,836,947 | 6/1989 | Lund et al. | 252/171 |
| 4,842,764 | 6/1989 | Lund et al. | 252/171 |
| 4,863,630 | 9/1989 | Swan et al. | 252/171 |
| 4,894,176 | 1/1990 | Swan et al. | 252/171 |

FOREIGN PATENT DOCUMENTS

| | | |
|---|---|---|
| 1-103686 | 4/1989 | Japan . |
| 1-137253 | 5/1989 | Japan . |
| 1-137259 | 5/1989 | Japan . |
| 1-139861 | 6/1989 | Japan . |

*Primary Examiner*—Linda Skaling
*Attorney, Agent, or Firm*—James E. Shipley

[57] ABSTRACT

Constant boiling, azeotrope-like mixtures of dichlorotrifluoroethane, 1,1-dichloro-1-fluoroethane and methanol and/or ethanol, the constant-boiling, azeotrope-like mixtures being useful in solvent cleaning applications.

20 Claims, No Drawings

CONSTANT-BOILING, AZEOTROPE-LIKE MIXTURES OF DICHLOROTRIFLUOROETHANE, 1,1-DICHLORO-1-FLUOROETHANE AND METHANOL AND/OR ETHANOL

INVENTION BACKGROUND

As modern electronic circuit boards evolve toward increased circuit and component densities, thorough board cleaning after soldering becomes more important. Current industrial processes for soldering electronic components to circuit boards involve coating the entire circuit side of the board with flux, and thereafter passing the flux-coated board over preheaters and through molten solder. The flux cleans the conductive metal parts and promotes solder adhesion. Commonly used solder fluxes generally consist of rosin, either used alone or with activating additives, such as amine hydrochlorides or oxalic acid derivatives.

After soldering, which thermally degrades part of the rosin, the remaining flux and its residues are often removed from the circuit boards with an organic solvent. The requirements for such solvents are very stringent. Defluxing solvents should have the following characteristics: be low boiling and nonflammable while having low toxicity and high solvency power, so that flux and flux residues can be removed without damaging the substrate being cleaned.

While boiling point, flammability and solvency characteristics can often be adjusted by mixing different solvents together, the mixtures that are formed are often unsatisfactory because they fractionate to an undesirable degree during use. Such solvent mixtures also fractionate during distillation which makes it virtually impossible to recover a solvent mixture with the original composition.

On the other hand, azeotrope-like mixtures, with their constant boiling point and constant composition characteristics, have been found to be very useful for these applications. Azeotrope-like mixtures exhibit constant boiling points and, for all practical purposes, they do not fractionate on boiling. These characteristics are also important when using solvent compositions to remove solder fluxes and flux residues from printed circuit boards. Preferential evaporation of the more volatile solvent mixture components would occur if the mixtures were not azeotrope-like. This would result in the mixtures having changed compositions and possibly less desirable solvency properties, such as lower rosin flux solvency and lower inertness toward the electrical components being cleaned. This azeotrope-like character is also desirable in vapor degreasing operations, where redistilled solvent is generally employed for final rinse cleaning.

In summary, a vapor defluxing or degreasing system operates as a still. Unless the solvent composition exhibits a constant boiling point, i.e., is azeotrope-like, fractionation will occur, and undesirable solvent distributions will result which could detrimentally affect the safety and efficacy of the cleaning operation.

A number of chlorofluorocarbon-based azeotrope or azeotrope-like compositions have been discovered and, in some cases, used as solvents for solder flux and flux residue removal from printed circuit boards, and also for miscellaneous degreasing applications. Some of the chlorofluorocarbons which are currently used for cleaning and other applications have been theoretically linked to depletion of the earth's ozone layer. As early as the mid-1970's, it was known that introduction of hydrogen into the chemical structure of the previously fully-halogenated chlorofluorocarbons reduces the chemical stability of these compounds. Hence, these now destabilized compounds would be expected to degrade more rapidly in the lower atmosphere and not reach the stratospheric ozone layer to any appreciable degree. What are needed, therefore, are substitute chlorofluorocarbons which have low theoretical ozone-depletion potential.

The chlorofluorocarbons of the constant boiling, azeotrope-like mixtures described herein contain hydrogen in their chemical structures. These chlorofluorocarbons have very low ozone-depletion potentials and are expected to decompose almost completely prior to reaching the stratosphere.

Unfortunately, as recognized in the art, it is not possible to predict the formation of azeotropes or constant boiling, azeotrope-like mixtures. This fact obviously complicates the search for new constant boiling compositions which have application in the field. Nevertheless, there is a constant effort in the art to discover new azeotropes or azeotrope-like compositions which have desirable solvency characteristics and, particularly, greater versatility in solvency power.

INVENTION SUMMARY

According to the present invention, constant boiling, azeotrope-like compositions have been discovered comprising admixtures of effective amounts of dichlorotrifluoroethane, 1,1-dichloro-1-fluoroethane and methanol and/or ethanol.

The constant boiling, azeotrope-like mixtures are admixtures of about 30-70 weight percent dichlorotrifluoroethane, about 69-25 weight percent 1,1-dichloro-1-fluoroethane and about 1-5 weight percent methanol and/or ethanol.

The present invention provides constant boiling, azeotrope-like compositions which can be used in solvent cleaning and blowing agent applications.

DETAILED DESCRIPTION OF THE INVENTION

The compositions of the instant invention comprise admixtures of effective amounts of dichlorotrifluoroethane (1,1-dichloro-2,2,2-trifluoroethane, $CHCl_2\text{-}CF_3$, boiling point$=28.7°$ C.; 1,2-dichloro-1,2,2-trifluoroethane, $CHClF\text{-}CClF_2$, boiling point$=30°$ C.), 1,1-dichloro-1-fluoroethane ($CFCl_2\text{-}CH_3$, boiling point$=32.4°$ C.) and methanol (boiling point$=64.7°$ C.) and/or ethanol (boiling point$=78.4°$ C.) to form constant boiling, azeotrope-like mixtures. In nomenclature conventional to the halofluorocarbon field, 1,1-dichloro-2,2,2-trifluoroethane is known as HCFC-123, 1,2-dichloro-1,2,2-trifluoroethane is known as HCFC-123a and 1,1-dichloro-1-fluoroethane is known as HCFC-141b. In the instant invention, dichlorotrifluoroethane may be a mixture of 1,1-dichloro-2,2,2-trifluoroethane and 1,2-dichloro-1,2,2-trifluoroethane.

By constant-boiling, azeotrope-like composition is meant a constant boiling liquid admixture of two or more substances, which admixture behaves as a single substance in that the vapor produced by partial evaporation or distillation of the liquid has the same composition as the liquid, i.e., the admixture distills without substantial change in composition. Constant boiling compositions, which are characterized as azeotrope-like, exhibit constant boiling points and constant compositions as compared with that of the non-azeotropic mixtures of the same substances.

For purposes of this invention, effective amount is defined as the amount of each component of the instant invention admixture which, when combined, results in the formation of the azeotrope-like compositions of the instant invention. This definition includes all component compositions of the azeotrope-like composition of the instant invention at any pressure to which it may be subjected, provided that, at the pressure selected, the composition continues to exhibit azeotrope-like characteristics. Therefore, effective amount includes the weight percentages of each component of the compositions of the instant invention which, when combined, form azeotrope-like compositions at pressures other than atmospheric pressure. When the pressure applied to these compositions is adjusted to atmospheric pressure, i.e., 760 mm Hg, they will boil at the atmospheric boiling points described herein for the azeotrope-like compositions.

It is possible to characterize a constant boiling admixture which may appear under many guises, depending upon the conditions chosen, by any of several criteria:

The composition can be defined as constant boiling, azeotrope-like mixtures of A, B and C since the very term "azeotrope-like" is at once both definitive and limitative, and requires that effective amounts of A, B and C form these unique compositions of matter which are constant boiling admixtures.

It is well known by those skilled in the art that, at different pressures, the composition of a given constant-boiling, azeotrope-like mixture will vary, at least to some degree, and changes in pressure will also change, at least to some degree, the boiling point temperature. Thus constant-boiling, azeotrope-like mixtures of A, B and C represent unique types of relationships but with variable compositions which depend on temperature and/or pressure. Therefore, compositional ranges, rather than fixed compositions, are often used to define constant boiling, azeotrope-like mixtures.

The composition can be defined as a particular weight percent relationship or mole percent relationship of A, B and C, while recognizing that such specific values point out only one particular such relationship and that, in actuality, a series of such relationships, represented by A, B and C, actually exist for a given constant-boiling, azeotrope-like mixture varied by the influence of pressure.

A constant-boiling, azeotrope-like mixture of A, B and C can be characterized by defining the composition as a constant-boiling, azeotrope-like mixture characterized by a boiling point at a given pressure, thus giving identifying characteristics without unduly limiting the scope of the invention by a specific numerical composition, which is limited by and is only as accurate as the analytical equipment available.

The three component mixtures of dichlorotrifluoroethane, HCFC-141b and methanol formed by combining about 30-70 weight percent HCFC-123, about 69-25 weight percent HCFC-141b and about 1-5 weight percent methanol and/or ethanol are characterized as constant-boiling, azeotrope-like mixtures in that mixtures within this range exhibit a substantially constant boiling point at constant pressure. Being substantially constant boiling, the mixtures do not tend to fractionate to any great extent upon evaporation. After evaporation, only a small difference exists between the composition of the vapor and the composition of the initial liquid phase. This difference is such that the compositions of the vapor and liquid phases are considered substantially identical. Accordingly, any mixture within the aforestated compositional ranges exhibit properties which are characteristic of a constant boiling, azeotrope-like mixture.

The constant-boiling, azeotrope-like mixtures of the instant invention boil at about 30° C., at substantially atmospheric pressure.

It has been found that constant-boiling, azeotrope-like mixtures which contain a minimum of 33 weight percent dichlorotrifluoroethane are nonflammable as determined by a flammability test similar to ASTM E918.

The more preferred constant-boiling, azeotrope-like mixture of the instant invention has the following composition: 36 weight percent dichlorotrifluoroethane, 61 weight percent 1,1-dichloro-1-fluoroethane and 3 weight percent methanol. The constant-boiling, azeotrope-like mixture of this composition boils at about 30° C., at substantially atmospheric pressure.

The three component mixtures of dichlorotrifluoroethane, HCFC-141b and ethanol formed by combining about 30-70 weight percent dichlorotrifluoroethane, about 69-25 weight percent HCFC-141b and about 1-5 weight percent ethanol are characterized as constant-boiling, azeotrope-like mixtures in that mixtures within this range exhibit a substantially constant boiling point at constant pressure. Being substantially constant boiling, the mixtures do not tend to fractionate to any great extent upon evaporation. After evaporation, only a small difference exists between the composition of the vapor and the composition of the initial liquid phase. This difference is such that the compositions of the vapor and liquid phases are considered substantially identical. Accordingly, any mixture within the aforestated compositional ranges exhibit properties which are characteristic of a constant boiling, azeotrope-like mixture.

A preferred constant-boiling, azeotrope-like composition of the instant invention is about 40 weight percent dichlorotrifluoroethane, about 59 weight percent 1,1-dichloro-1-fluoroethane and about 1 weight percent ethanol. The constant-boiling, azeotrope-like composition of of this mixture has a boiling point of about 31° C. at substantially atmospheric pressure.

The constant-boiling, azeotrope-like mixtures of the present invention permit easy recovery and reuse of the solvent from vapor defluxing and degreasing operations because of their azeotrope-like characteristics. As an example, the constant-boiling, azeotrope-like mixtures of this invention can be used in cleaning processes such as described in U.S. Pat. No. 3,881,949 which is incorporated herein by reference.

The constant-boiling, azeotrope-like mixtures of the instant invention can be prepared by any convenient method including mixing or combining the desired component amounts. A preferred method is to weigh the desired component amounts and thereafter combine them in a suitable container.

EXAMPLE 1

A one-plate, laboratory-distillation apparatus was used to determine the composition-versus-boiling point characteristics for the constant-boiling, azeotrope-like mixtures of the instant invention. Four compositions were selected for distillation range measurements:

Composition No. 1—29.6 weight percent 2,2-dichloro-1,1,1-trifluoroethane, 67.4 weight percent 1,1-dichloro-1-fluoroethane and 3.0 weight percent methanol.

Composition No. 2—49.3 weight percent 2,2-dichloro-1,1,1-trifluoroethane, 68.1 weight percent 1,1-dichloro-1-fluoroethane and 2.6 weight percent methanol.

Composition No. 3—69.0 weight percent 2,2-dichloro-1,1,1-trifluoroethane, 28.9 weight percent 1,1-dichloro-1-fluoroethane and 2.1 weight percent methanol.

Composition No. 4—39.2 weight percent 2,2-dichloro-1,1,1-trifluoroethane, 59.6 weight percent 1,1-dichloro-1-fluoroethane and 1.2 weight percent ethanol.

In each of the above cases using methanol, the constant-boiling, azeotrope-like mixture had a boiling-range temperature, corrected to 760 mm Hg pressure, of about 30° C. For the case with ethanol, the constant-boiling, azeotrope-like mixture had a boiling-range temperature, corrected to 760 mm Hg pressure, of about 31° C.

In Compositions 1 through 4, the 2,2-dichloro-1,1,1-trifluoroethane contained about 5 weight percent HCFC-123a based on the weight of the 2,2-dichloro-1,1,1-trifluoroethane.

EXAMPLE 2

A twenty-five theoretical plate laboratory-distillation apparatus was used to determine the compositions versus boiling-range temperature characteristics of the constant-boiling, azeotrope-like mixture cited in Example 1, Composition No. 1. The mixture was distilled at a 2:1 reflux ratio. Vapor and liquid temperatures were monitored and recorded. Distillation cuts were taken and analyzed for composition throughout the entire distillation. Data obtained from this distillation were as follows:

| | |
|---|---|
| Vapor-temperature range, °C. = | 29.5 ± 0.5 |
| 2,2-Dichloro-1,1,1-trifluoroethane, % = | 29.4 ± 0.2 |
| 1,1-Dichloro-1-fluoroethane, % = | 67.6 ± 0.4 |
| Methanol, % = | 3.0 ± 0.2 |

The above data indicate that the constant boiling azeotrope-like mixture of this invention does not fractionate under common industrial fractionating conditions.

EXAMPLE 3

A simple boil-off distillation experiment was performed on the constant-boiling, azeotrope-like mixture cited in Example 1, Composition No. 1. The diminished distillation residue was analyzed periodically throughout the boil-off to determine its composition. Data obtained from this distillation were as follows:

| | | Weight Percentages | | |
|---|---|---|---|---|
| % Boil-Off | Temp., °C. | Methanol | HCFC-123 | HCFC-141b |
| 0 | 30.1 | 3.1 | 29.5 | 67.4 |
| 20 | 30.2 | 3.2 | 29.2 | 67.6 |
| 40 | 30.2 | 3.2 | 29.2 | 67.6 |
| 60 | 30.2 | 3.2 | 29.1 | 67.7 |
| 80 | 30.2 | 3.4 | 28.6 | 68.0 |
| 90 | 30.2 | 3.5 | 28.5 | 68.0 |
| 95 | 30.2 | 3.7 | 28.3 | 68.0 |

The above data indicate that the composition of the constant-boiling, azeotrope-like mixture of the instant invention does not change significantly during boil-off.

EXAMPLE 4

A simple boil-off distillation experiment was performed on the constant-boiling, azeotrope-like mixture cited in Example 1, Composition No. 4. The diminished distillation residue was analyzed periodically throughout the boil-off to determine its composition. Data obtained from this distillation were as follows:

| | | Weight Percentages | | |
|---|---|---|---|---|
| % Boil-Off | Temp., °C. | Ethanol | HCFC-123 | HCFC-141b |
| 0 | 31.4 | 1.2 | 39.2 | 59.6 |
| 20 | 31.4 | 1.2 | 39.6 | 59.2 |
| 40 | 31.4 | 1.2 | 39.2 | 59.6 |
| 60 | 31.4 | 1.3 | 38.5 | 60.2 |
| 80 | 31.5 | 1.6 | 39.7 | 58.7 |
| 90 | 31.6 | 1.6 | 36.7 | 61.7 |
| 95 | 31.6 | 1.9 | 36.2 | 61.9 |

The above data indicate that the composition of the constant-boiling, azeotrope-like mixture of the instant invention does not change significantly during boil-off.

EXAMPLE 4

The three sumps of a vapor degreaser were filled to their appropriate operating levels with the constant-boiling, azeotrope-like mixture cited in Example 3. The vapor degreaser was then run at operational stand-by conditions (reflux) for 100 hours. No cleaning operations were performed during this test. Compositional data obtained from the three sumps after the 100-hour test was completed were as follows:

| Sump No. | Elapsed Time, Hours | Weight Percentages | | |
|---|---|---|---|---|
| | | Methanol | HCFC-123 | HCFC-141b |
| 1 | 0 | 3.1 | 29.5 | 67.4 |
| | 100 | 3.9 | 29.0 | 67.1 |
| 2 | 0 | 3.1 | 29.5 | 67.4 |
| | 100 | 3.0 | 29.7 | 67.3 |
| 3 | 0 | 3.1 | 29.5 | 67.4 |
| | 100 | 3.0 | 29.7 | 67.3 |

The above data indicate that the liquid composition in each sump remained essentially unchanged throughout the experiment.

EXAMPLE 5

The three sumps of a vapor degreaser were filled to their appropriate operating levels with the constant-boiling, azeotrope-like mixture cited in Example 1, Composition 4. The vapor degreaser was then run at operational stand-by conditions (reflux) for 19 hours. No cleaning operations were performed during this test. Compositional data obtained from the three sumps after the 19-hour test was completed were as follows:

| Sump No. | Elapsed Time, Hours | Weight Percentages | | |
|---|---|---|---|---|
| | | Ethanol | HCFC-123 | HCFC-141b |
| 1 | 0 | 1.2 | 40.2 | 58.6 |
| | 19 | 1.9 | 37.9 | 60.2 |
| 2 | 0 | 1.3 | 40.2 | 58.5 |
| | 19 | 1.2 | 39.7 | 59.1 |
| 3 | 0 | 1.2 | 40.6 | 58.2 |
| | 19 | 1.1 | 40.3 | 58.6 |

The above data indicate that the liquid composition in each sump remained essentially unchanged throughout the experiment.

EXAMPLE 6

Several single-sided circuit boards were coated with activated rosin flux and soldered by passing the boards over a preheater to obtain a top-side board temperature of approximately 200° F. and then through 500° F. molten solder. The soldered boards were defluxed separately with the four compositions cited in Example 1, by suspending a circuit board, first, for three minutes in the boiling sump which contained the constant-boiling, azeotrope-like mixture, then, for one minute in the rinse sump which contained some of the same constant-boiling, azeotrope-like mixture and finally, for one minute in the solvent vapor above the boiling sump. The boards cleaned in each constant boiling, azeotrope-like mixture had no visible residue remaining on them.

I claim:

1. A constant-boiling, azeotrope-like composition consisting essentially of about 30–70 weight percent dichlorotrifluoroethane selected from the group consisting of 1,1-dichloro-2,2,2-trifluorethane and 1,2-dichloro-1,2,2-trifluoroethane and mixtures thereof, about 69–25 weight percent 1,1-dichloro-1-fluoroethane and about 1–5 weight percent ethanol, such composition having a boiling point of about 31° C. at substantially atmospheric pressure.

2. The constant-boiling, azeotrope-like composition of claim 1 consisting essentially of at least 33 weight percent dichlorotrifluoroethane.

3. The constant-boiling, azeotrope-like composition of claim 2 consisting essentially of about 40 weight percent dichlorotrifluoroethane, about 59 weight percent 1,1-dichloro-1-fluoroethane and about 1 weight percent ethanol.

4. A process for cleaning a solid surface which comprises treating said surface with the constant-boiling, azeotrope-like composition of claim 1.

5. The process of claim 4, wherein the surface is a printed circuit board contaminated with flux and flux residues.

6. The process of claim 5, wherein the surface is a metal.

7. The process for expanding a polymeric foam comprising utilizing the constant-boiling, azeotrope-like composition of claim 1 as a blowing agent.

8. The process of claim 7 wherein the polymeric foam is a polyurethane foam.

9. Azeotrope-like compositions consisting essentially of 1,1-dichloro-1-fluoroethane, dichlorotrifluoroethane selected from the group consisting of 1,2-dichloro-1,2,2-trifluoroethane, 1,1-dichloro-2,2,2-trifluoroethane or mixtures thereof and ethanol wherein the composition boils at about 31° C. at substantially atmospheric pressure.

10. The method of cleaning a solid surface which comprises treating said surface with an azeotrope-like composition as defined in claim 9.

11. A constant-boiling azeotrope-like composition consisting essentially of about 30–70 weight percent dichlorotrifluoroethane selected from the group consisting of 1,1-dichloro-2,2,2-trifluoroethane and 1,2-dichloro-1,2,2-trifluoroethane and mixtures thereof, about 69–25 weight percent 1,1-dichloro-1-fluoroethane and about 1–5 weight percent methanol, such composition having a boiling point of about 30° C. at substantially atmospheric pressure.

12. The constant-boiling, azeotrope-like composition of claim 11 consisting essentially of at least 33 weight percent dichlorotrifluoroethane.

13. The constant-boiling, azeotrope-like composition of claim 12 consisting essentially of about 36 weight percent dichlorotrifluoroethane, about 61 weight percent 1,1-dichloro-1-fluoroethane and about 3 weight percent methanol.

14. A process for cleaning a solid surface which comprises treating said surface with the constant-boiling azeotrope-like composition of claim 11.

15. The process of claim 14, wherein the surface is a printed circuit board contaminated with flux and flux residues.

16. The process of claim 15, wherein the surface is a metal.

17. The process for expanding a polymeric foam comprising utilizing the constant-boiling, azeotrope-like composition of claim 11 as a blowing agent.

18. The process of claim 17 wherein the polymeric foam is a polyurethane foam.

19. Azeotrope-like compositions consisting essentially of 1,1-dichloro-1-fluoroethane, dichlorotrifluoroethane selected from the group consisting of 1,2-dichloro-1,2,2-trifluoroethane, 1,1-dichloro-2,2,2-trifluoroethane or mixtures thereof and methanol wherein the composition boils at about 30° C. at substantially atmospheric pressure.

20. The method of cleaning a solid surface which comprises treating said surface with an azeotrope-like composition as defined in claim 19.

* * * * *